(12) United States Patent
Ireland

(10) Patent No.: US 7,138,719 B2
(45) Date of Patent: Nov. 21, 2006

(54) TRENCH INTERCONNECT STRUCTURE AND FORMATION METHOD

(75) Inventor: Philip J. Ireland, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 229 days.

(21) Appl. No.: 10/232,184

(22) Filed: Aug. 29, 2002

(65) Prior Publication Data

US 2004/0041204 A1    Mar. 4, 2004

(51) Int. Cl.
*H01L 23/52* (2006.01)

(52) U.S. Cl. .................. 257/774; 257/734; 257/773

(58) Field of Classification Search ............... 257/734, 257/741, 750, 749, 751, 752, 753, 754, 755, 257/756, 757, 758, 759, 760, 761, 762, 763, 257/764, 765, 766, 767, 768, 769, 770, 771, 257/772, 773, 774, 775, 776
See application file for complete search history.

(56) References Cited

U.S. PATENT DOCUMENTS

| | | | |
|---|---|---|---|
| 5,804,501 A * | 9/1998 | Kim | |
| 5,918,149 A | 6/1999 | Besser et al. ............... | 438/680 |
| 6,139,697 A | 10/2000 | Chen et al. ............ | 204/192.15 |
| 6,156,643 A | 12/2000 | Chan et al. ................. | 438/638 |
| 6,200,895 B1 * | 3/2001 | Givens et al. | |
| 6,268,279 B1 | 7/2001 | Okada ........................ | 438/624 |
| 6,312,874 B1 | 11/2001 | Chan et al. ................. | 430/314 |
| 6,331,482 B1 | 12/2001 | Honeycutt et al. .......... | 438/642 |
| 6,448,649 B1 * | 9/2002 | Lee et al. | |
| 6,500,706 B1 * | 12/2002 | Chi | |
| 6,518,669 B1 * | 2/2003 | Saiki et al. | |
| 2002/0151165 A1 * | 10/2002 | Chung | |

* cited by examiner

*Primary Examiner*—Nathan J. Flynn
*Assistant Examiner*—Kevin Quinto
(74) *Attorney, Agent, or Firm*—Schwegman, Lundberg, Woessner & Kluth, P.A.

(57) ABSTRACT

Embodiments concern vertical interconnect structures having sub-micron widths for use in integrated circuits, and methods of their manufacture, which result in reduced interconnect resistance, $I^2R$ losses, and defects or variations due to cusping. Embodiments of the methods involve forming an opening in an insulating layer, where the opening forms a trench that exposes an underlying portion of a metal layer. Additional embodiments involve depositing multiple layers of conductive material within the opening and above the insulating layer, where one of the conductive layers includes aluminum and is deposited using a "cold aluminum" process, and a second one of the conductive layers also includes aluminum, but is deposited using a "hot aluminum" process. The interconnect structures are adapted for use in conjunction with memory cells and apparatus incorporating such memory cells, as well as other integrated circuits.

29 Claims, 12 Drawing Sheets

TRENCH INTERCONNECT STRUCTURE AND FORMATION METHOD

TECHNICAL FIELD

The present invention relates generally to formation of conductive interconnects on an integrated circuit, and more specifically to forming submicron VLSI trench vias that electrically interconnect metal layers of an integrated circuit.

BACKGROUND

The integrated circuit industry continues to progress in electronic circuit densification and miniaturization. This progress has resulted in increasingly compact and efficient semiconductor devices, which in turn enable the systems into which these devices are incorporated to be made smaller and less power consumptive.

Among the semiconductor device features that are being reduced in size are the vias, which electrically connect a device's various metal layers. A device's metal layers often include conductive planes that conduct power or provide grounding, and also include patterned conductive layers that serve as input/output and control lines for components on the device (e.g., transistors, resistors, capacitors, etc.). Conductive vias with a circular cross-sectional area are most often used to electrically connect these metal layers. These vias are typically drawn square on the design database.

Two important characteristics of a via are its resistance and the $I^2R$ losses associated with the structure. Ideally, the via's resistance should be as close to zero as possible, so that the via has high conductivity. In addition, the $I^2R$ loss should be as low as possible, which lowers the device temperature and, in turn, lowers resistance even further. A via's resistance and $I^2R$ losses depend on the via's physical attributes (e.g., shape, height, width), the materials used to form the via, and the methods used to deposit the conductive materials into the via openings. Basically, vias are formed by etching openings in dielectric layers of a device, and filling those openings with conductive material.

Via openings are currently designed with diameters within the half micron range, and the aspect ratio of the via openings (i.e., the ratio of the opening's height to its diameter) is becoming very high. For example, aspect ratios for via openings currently can be greater than 3. Because of this, it is difficult to deposit, with good coverage, the necessary conducting material in these tiny, narrow, high-sided via openings. As will be described in more detail below, this makes it difficult to form increasingly miniaturized vias that retain a high conductivity.

With regard to the materials used for the vias, aluminum is commonly used because of its good conductivity and ease of deposition. However, pure aluminum is subject to electromigration failures, which occur when the flow of electrons through the material dislodges aluminum atoms and causes an open circuit condition. This results in poor electrical conduction or total failure.

Another problem that occurs during via formation is that, as a result of exposure to the ambient, a native oxide layer can grow in the bottom of a via opening. These layers are highly insulative and can cause a high resistance, which at times can result in via failure. Typically, a diffusion barrier and/or electrical shunt of a material such as titanium nitride, also referred to as Ti N, is used to remove the native oxide layer. Therefore, methods used for filling via openings should be compatible with the currently known methods for depositing diffusion barriers.

With regard to the processes used to fill via openings with conductive material, one of two processes are commonly used: chemical vapor deposition (CVD); and physical vapor deposition (PVD), also known as sputtering. Limitations of the materials that can be deposited with CVD make it impractical for many applications, so PVD is more commonly used.

One problem associated with PVD is that "cusping" may occur during sputtering or reflowing aluminum into high aspect ratio via openings. Cusping occurs as aluminum aggregates at the top of the via opening and overhangs into the center of the via opening. Cusping can block the via opening before a proper thickness of aluminum can be,formed at the bottom of the via opening. This results in a partially filled via opening with poor electrical connection characteristics, and can cause total via failure.

One method for forming a via, which addresses some of the problems described above, is described by Honeycutt et al. in U.S. Pat. No. 6,331,482 B1, issued on Dec. 18, 2001. Using the Honeycutt et al. method, a via is formed by first depositing a standard diffusion barrier in a via opening. A layer of germanium is then formed over the diffusion barrier, and aluminum or aluminum alloy is reflow sputtered into the via opening. Although the technique addresses some of the process and material concerns with vias described above, it does not fully address the inherent resistance and $I^2R$ loss issues relating to the via's physical configuration (e.g., the via's shape, aspect ratio, and size).

Accordingly, what is needed is a submicron VLSI via with very low resistance and $I^2R$ loss. Particularly needed is a via which has higher reliability than prior art vias. Also needed is a method of forming these vias, which reduces the occurrence of cusping, and improves the electrical characteristics and reliability of the vias.

SUMMARY

Embodiments of the present invention provide a trench via structure, which can be reliably formed in submicron dimensions with very low resistance and $I^2R$ loss. The trench vias electrically interconnect metal layers of a semiconductor device. Embodiments of the invention form the trench vias simultaneously with forming one of the metal layers, by sequentially depositing layers of conductive material in the via openings and on the top surface of the dielectric layer in which the vias are formed. The particular materials used in the sequentially-deposited layers, and the thicknesses of these layers, enable trench and other vias to be formed with a lower incidence of cusping and electromigration failures.

For one embodiment, the invention provides a method of forming a vertical interconnect structure. The method includes forming an opening extending vertically downward through an insulating layer to an underlying portion of a first metal layer, where a length of the opening in a horizontal plane is sufficiently greater than a width of the opening in the horizontal plane so that the opening has a trench shape. The method further includes filling the opening with conductive material to form a conductive trench via, while simultaneously forming a second metal layer above the insulating layer.

For another embodiment, the method includes forming an opening extending vertically downward through an insulating layer to an underlying portion of a first metal layer, and depositing at least three layers within the opening. A coating layer of a conductive material is deposited in contact with a bottom and sidewalls of the opening. A first conductive layer containing aluminum is deposited into the opening and in contact with the coating layer at a first temperature. A second conductive layer containing aluminum is deposited into the opening and in contact with the first conductive layer at a second temperature that is higher than the first temperature. The coating layer, the first conductive layer, and the second conductive layer substantially fill the opening while simultaneously forming a second metal layer above the insulating layer.

For yet another embodiment, the method includes forming an opening extending vertically downward through an insulating layer to an underlying portion of a first metal layer, and depositing at least three layers within the opening. A coating layer of a conductive material is deposited in contact with a bottom and sidewalls of the opening. A first conductive layer containing aluminum is deposited into the opening and in contact with the coating layer, wherein the first conductive layer partially fills the opening. A second conductive layer containing aluminum is deposited into the opening and in contact with the first conductive layer, where the second conductive layer substantially fills a remainder of the opening.

For a further embodiment, a portion of a semiconductor device is formed, which includes a conductive contact to an active region. A first metal layer is formed directly above and in contact with the portion of the semiconductor device, so that the first metal layer physically and electrically connects with the contact. An insulating layer is formed above the first metal layer. An opening is formed extending vertically downward through the insulating layer to an underlying portion of the first metal layer. A length of the opening in a horizontal plane is sufficiently greater than a width of the opening in the horizontal plane so that the opening has a trench shape. The opening is filled with conductive material to form a conductive trench via, while simultaneously forming a second metal layer above the insulating layer.

Further embodiments of the invention include semiconductor structures produced using one or more methods of the invention, as well as apparatus, devices, modules and systems making use of such semiconductor structures.

It will be recognized that the methods of the various embodiments can be combined in practice, either concurrently or in succession. Various permutations and combinations will be readily apparent to those skilled in the art.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention.

Terminology

The terms "wafer" and "substrate" used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures that are new or are well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

The terms "horizontal" and "vertical" are used to explain the relative orientations of particular views. For the purposes of this description, assuming a semiconductor wafer or device is laid flat along a horizontal plane, a "top-down" or "horizontal" view of the device indicates a view of the device from above. Conversely, a "side" or "vertical" view of the device indicates a view of the device from the side. In the figures, any cut-away view is referred to as a "cross-sectional" view. An "elevational" view is a view of an exterior surface, and a "perspective" view is a three-dimensional view.

To distinguish conductive structures (e.g., vias) that connect distinct layers of a semiconductor device from conductive structures within a single layer, the terms "interconnect structure" and "inter-layer interconnect structure" are used and defined herein as a conductive structure that electrically connects portions of at least two distinct metal layers of a semiconductor device. An interconnect structure can include a circular via or a "trench via," described below.

Figure 2:
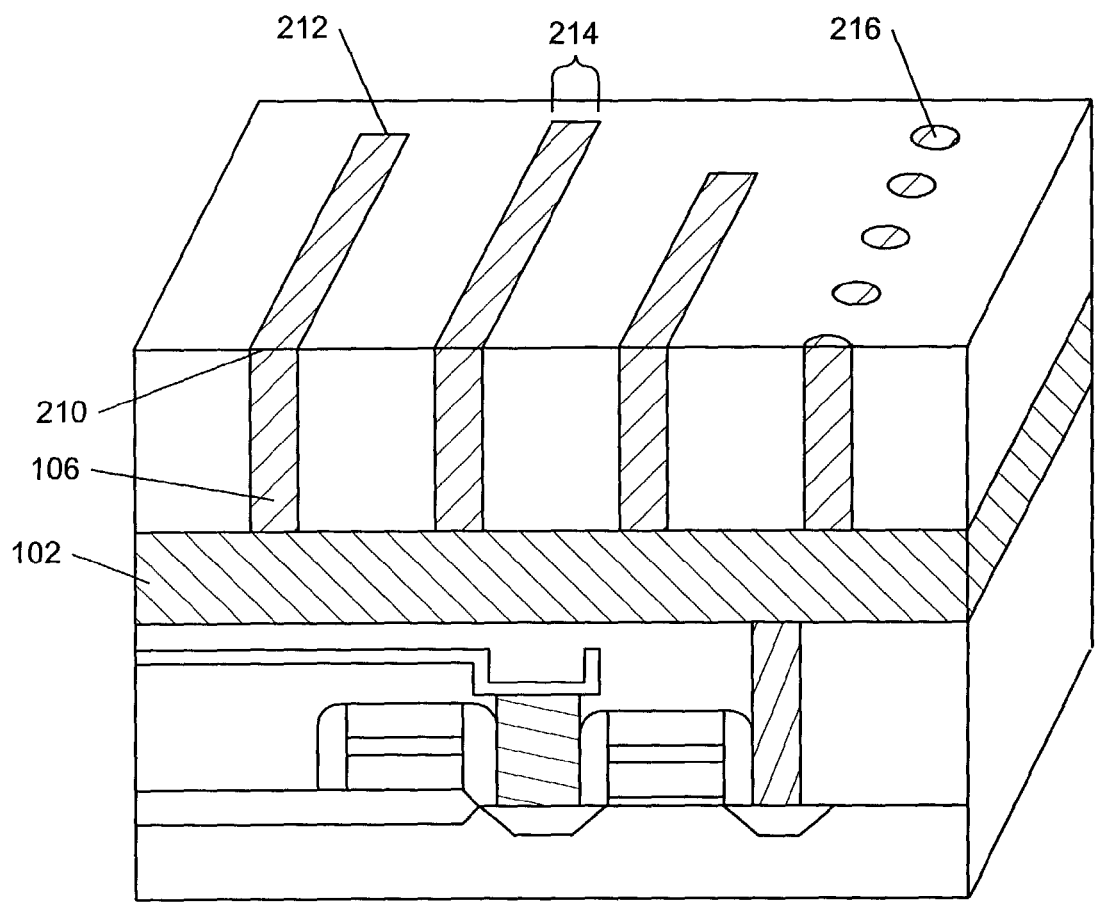
FIG. 2 illustrates a perspective, cross-sectional view of the portion of the semiconductor device illustrated in FIG. 1 with the second metal layer removed to show both top and side cross-sectional views of trench vias.

A "trench via" or "trench interconnect structure" is defined herein as an interlayer interconnect structure having a cross-sectional area, along a horizontal plane, that is roughly rectangular, as illustrated in FIG. 2, which will be referred to more extensively later. The "length" of a trench via, is defined as the dimension from one end 210 of the via to the other end 212 of the via. The length of a trench via is limited or bounded by the areas of the metal portions that the trench via is designed to interconnect.

Trench Vias

In one embodiment of the present invention, trench vias are used as inter-layer interconnect structures between metal layers of a semiconductor device. The trench vias can exist within a dielectric layer in conjunction with conventional circular vias, which provide other interconnections between metal layers.

Using trench via formation methods described later, the trench vias of the various embodiments can be formed in submicron dimensions, while still having very low resistance and $I^2R$ losses. In addition, the trench vias of the various embodiments have higher reliability than vias formed using prior art methods, because the methods of forming the trench vias, in accordance with the various embodiments, reduce the occurrence of cusping and increase the electrical characteristics and reliability of the trench vias, even at high aspect ratios.

Although structures also referred to as "trenches" are sometimes used for other purposes within semiconductor devices, trenches have not been reliably used to interconnect distinct metal layers within a semiconductor device. For example, trenches are sometimes formed as a part of a particular metal layer, where these trenches act as "wires" that enable power, ground, input/output paths or control signals to be provided to components on a semiconductor device (e.g., transistors, resistors, capacitors, etc.). These prior art trenches represent the wiring itself, while the trenches referred to in the context of the present invention refer to the inter-layer connections. For metals, the inter-layer connections are referred to as vias. Here, trench lengths are limited by the overlapping areas of the portions of the metal layers that the trench vias are used to interconnect. The trench lengths can range from short to very long.

According to the prior art, the metal layers that include trenches are sometimes formed using a damascene process, where openings for conductive trenches and other layer features are formed in a dielectric layer, and then conductive material is deposited within the openings to form the layer's trenches and other features. For example, a metal layer having conductive trenches, formed using a damascene process, is described by Chan et al. in U.S. Pat. No. 6,156,643, issued on Dec. 5, 2000. Similar structures are also described by Okada in U.S. Pat. No. 6,268,279 B1, issued on Jul. 31, 2001. Rather than interconnecting two or more metal layers, which is the function provided by the trench vias of the various embodiments of the invention, the prior art trenches represent the metal layer itself. The trenches within such a layer are interconnected to devices or other layers using conventional circular vias.

Figure 1:
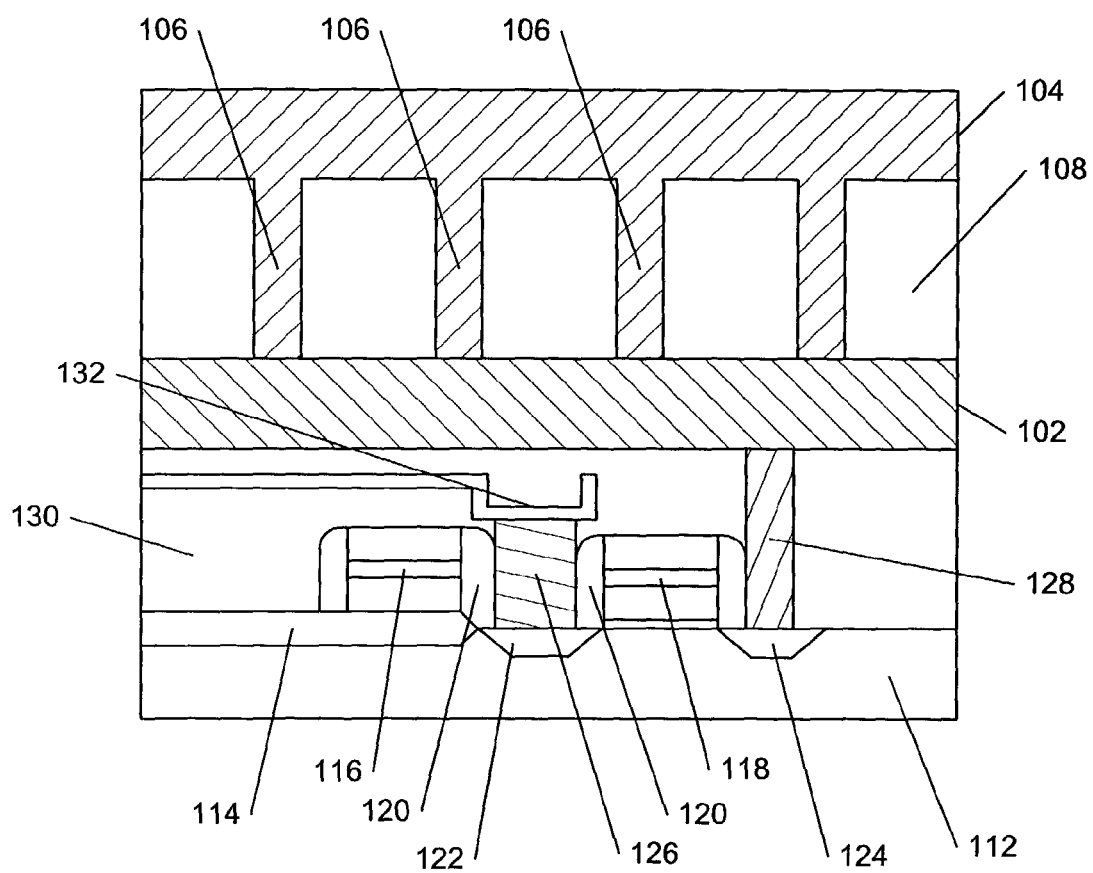
FIG. 1 illustrates a side, cross-sectional view of a portion of a semiconductor device in accordance with an embodiment of the present invention.

In one embodiment, trench vias are used to interconnect metal layers within a memory device, such as a DRAM (Dynamic Random Access Memory). FIG. 1 illustrates a side, cross-sectional view of a portion of a semiconductor device, which includes a DRAM memory cell and two or more metal layers 102, 104, in accordance with an embodiment of the invention. The metal layers 102, 104 are interconnected, at least in part, using one or more trench vias 106, in accordance with one embodiment of the present invention.

A typical DRAM includes an array of memory cells. A DRAM cell generally consists of a capacitor coupled through a transistor to a digit line, also commonly referred to as a bitline. The wafer fragment illustrated in FIG. 1 includes a semiconductive material 112, field oxide region 114, and wordlines 116, 118. Nitride spacers 120 are adjacent wordlines 116, 118. Node locations 122, 124 are adjacent to wordlines 116, 118, and are diffusion regions within semiconductive material 112. Conductive structures 126, 128 extend upward from node locations 122, 124 into or through an insulative layer 130. The upper surface of conductive structure 126 contacts a capacitor construction 132, which serves to store a bit of information. Conductive structure 128 serves as a contact to metal layer 102, which includes the digit line to the memory cell. During operation, the capacitor construction 132 is electrically connectable to contact 128 through a transistor gate comprised by wordline 118.

Typically, the memory cells are arranged in an array and each cell has an address identifying its location in the array. The array includes a configuration of intersecting conductive lines, and memory cells are associated with the intersections of the lines. In order to read from or write to a cell, the particular cell in question must be selected or addressed. The address for the selected cell is represented by input signals to a word line decoder and to a digit line decoder. The word line decoder activates a word line in response to the word line address. The selected word line activates the access gates for each of the memory cells in communication with the selected word line. The digit line decoder selects a digit line pair in response to the digit line address. For a read operation, the selected word line activates the access gates for a given word line address, and data is latched to the digit line pairs.

In one embodiment, some or all digit lines are provided within first metal layer 102. The first metal layer 102, in turn, is electrically connected to second metal layer 104 through trench vias 106, which function as vertical interconnect structures through a dielectric layer 108. The second metal layer 104 serves to carry voltage signals that are transmitted to and received from the first metal layer 102 through trench vias 106.

In one embodiment, at least one and potentially all of the vertical interconnect structures through dielectric layer 108 are trench vias 106. Other vias having conventional circular cross-sectional areas also can exist in conjunction with the trench vias 106, either within the same dielectric layers or within other layers of the device.

FIG. 2 illustrates a perspective, cross-sectional view of the portion of the semiconductor device illustrated in FIG. 1 with the second metal layer 104 removed to show both top and side cross-sectional views of trench vias 106. In one embodiment, the length of a trench via (i.e., the dimension from one end 210 of the via to the other end 212 of the via) is at least twice as long as the width 214 of the via. Depending on the device design, the length of any particular trench via could be more than two, five, ten, twenty, fifty, one hundred or more times the width 214 of the via. This distinguishes the trench vias of the various embodiments from conventional circular vias. The term "length" is not applicable to a circular via, as such a via has a uniform, cross-sectional diameter. Circular vias 216 can be formed through the same layers as trench vias 106.

Figure 3:
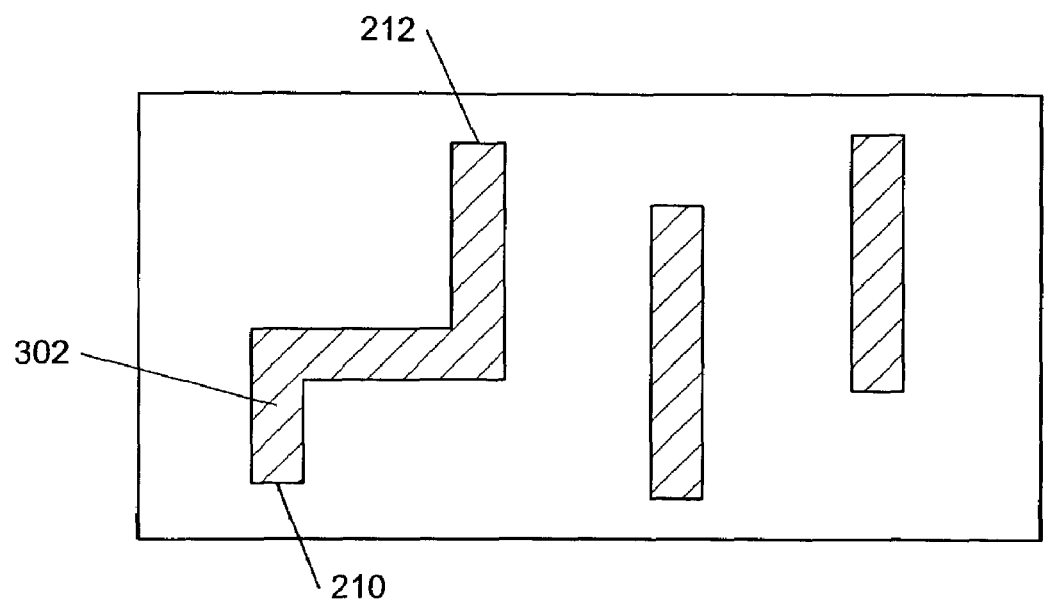
FIG. 3 illustrates a top-down, cross-sectional view of a trench via that is bent in accordance with another embodiment of the invention.
Figure 4:
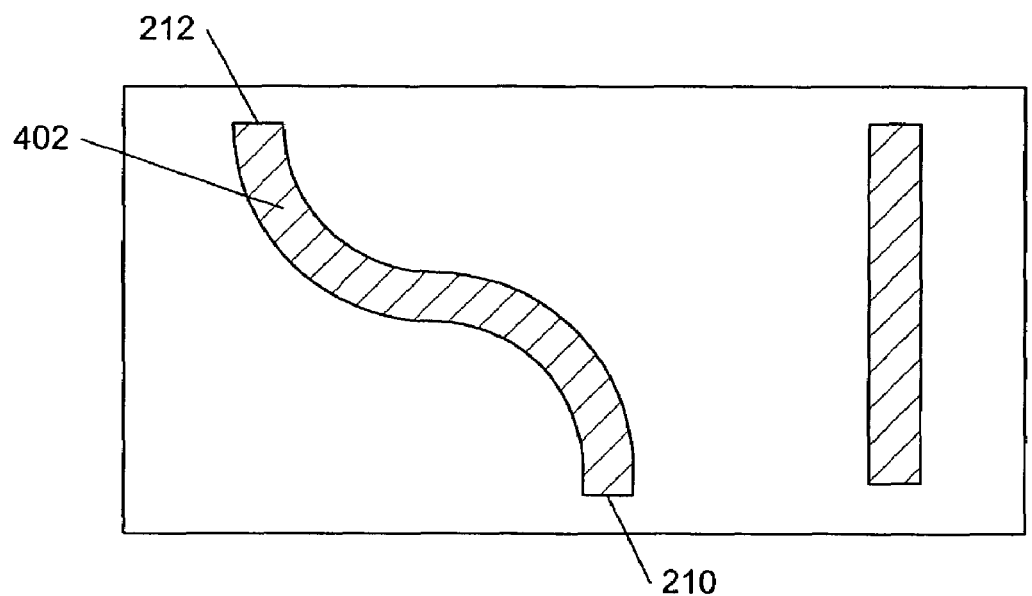
FIG. 4 illustrates a top-down, cross-sectional view of a trench via having an irregular shape in accordance with still another embodiment of the invention.

Although FIG. 2 illustrates straight trench vias 106, trench vias could be bent or have other shapes, in other embodiments. For example, FIG. 3 illustrates a top-down, cross-sectional view of a trench via 302 that is bent, and FIG. 4 illustrates a top-down, cross-sectional view of a trench via 402 having an irregular shape, in accordance with other embodiments of the invention. Virtually any length or shape of via could be formed using the methods of the embodiments of the present invention.

It will be understood that the above description of a DRAM cell is intended to provide a general understanding of the memory and is not a complete description of all the elements and features of a DRAM. Although the description shows how embodiments of the present invention are implemented in a DRAM, trench vias (e.g., vias 106) could be used to interconnect metal layers within other types of devices, as well. For example, the embodiments of the present invention could be implemented in other types of memory devices, microprocessors, Application Specific Integrated Circuits (ASICs) or virtually any other semiconductor device having two or more metal layers. In particular, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

Method of Forming Trench Vias

FIGS. 5–9 are side, cross-sectional views of a portion of a semiconductor device during various processing stages in accordance with an embodiment of the invention. For illustration purposes, these figures depict the formation of a portion of a DRAM memory device, and a single memory cell is illustrated.

Figure 5:
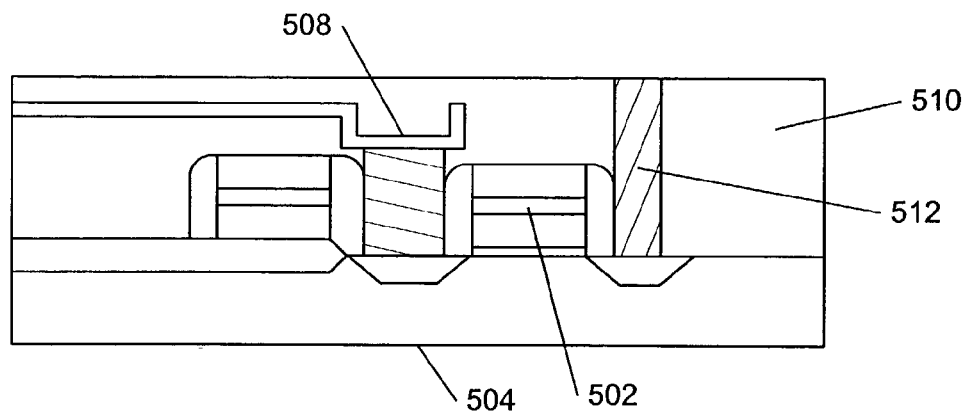
FIGS. 5–9 are side, cross-sectional views of a portion of a semiconductor device during various processing stages in accordance with an embodiment of the invention.

To begin the process, a portion of a semiconductor device is formed, as illustrated in FIG. 5. In the example embodiment, the portion of the semiconductor device is a DRAM memory cell, which includes a transistor 502 and a capacitive structure 508 formed on a substrate 504. Transistor 502 is activated through a conductive contact 512. When activated, transistor 502 allows data to be stored into or retrieved from capacitive structure 508.

A top surface of conductive contact 512 is exposed so that the contact 512 can be electrically connected to one or more conductive layers above the memory cell. Accordingly, contact 512 either extends to the top of or above dielectric 510, or an opening is formed in dielectric 510, thus exposing a portion of contact 512. Methods used for forming the portion of the semiconductor device are well understood in the art, and are outside the scope of the present invention. Accordingly, for purposes of brevity, those methods are not described herein.

Figure 6:
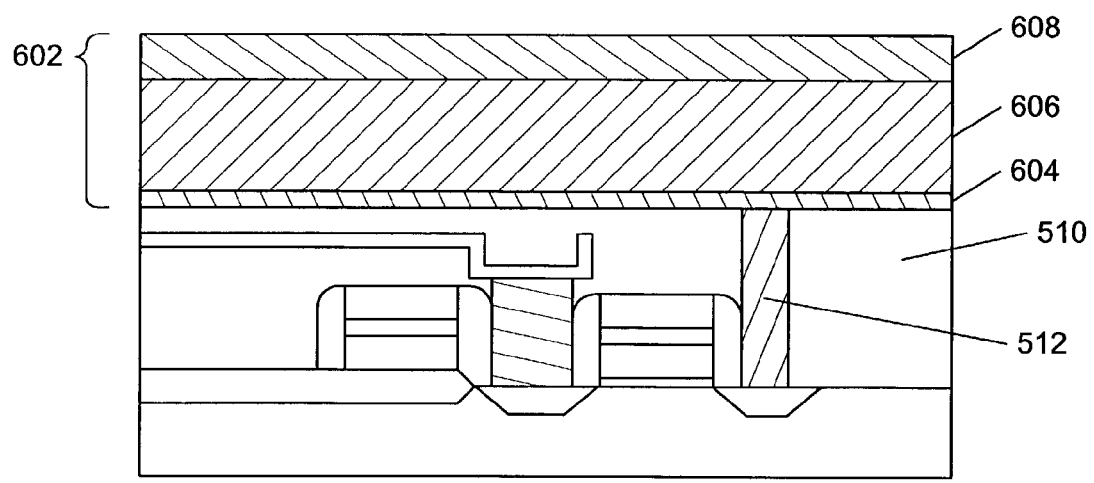

After the portion of the semiconductor device is formed, a patterned conductive layer 602 is formed on the top surface of the dielectric layer 510, as illustrated in FIG. 6. This conductive layer is referred to herein as the first metal layer, or the "M1" layer. The patterned conductive layer 602 comes into electrical contact with conductive contact 512.

In one embodiment, the M1 layer 602 includes three layers of conductive material, which are sequentially deposited using standard deposition techniques (e.g., CVD and/or PVD). The lowest layer 604 includes titanium, and has a thickness in a range of about 80–120 angstroms, with a thickness of about 100 angstroms being present in one embodiment. The middle layer 606 includes an aluminum/copper alloy, and has a thickness in a range of about 2500–3500 angstroms, with a thickness of about 3000 angstroms being present in one embodiment. The top layer 608 includes TiN, and has a thickness in a range of about 200–300 angstroms, with a thickness of about 250 angstroms being present in one embodiment.

In other embodiments, layers 604, 606, and 608 could be thicker or thinner than the ranges specified above. In still other embodiments, the M1 layer 602 could include more or fewer conductive layers (e.g., from 1 to 10), or those layers could be formed from different materials (e.g., copper), or those layers could be arranged in a different configuration (e.g., a TiN layer could exist as the bottom layer).

Figure 7:
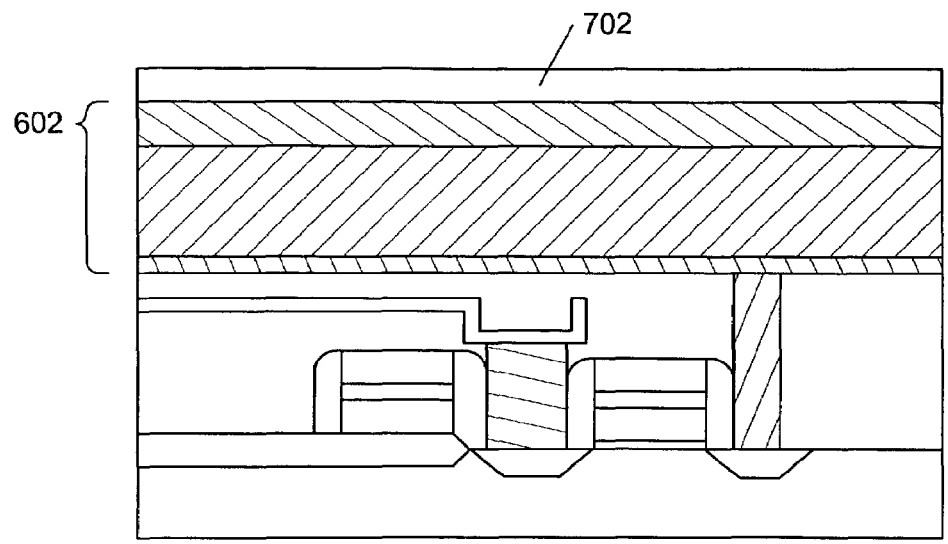

After forming the M1 layer 602, an antireflection coating 702 is formed on the top surface of the M1 layer 602, in one embodiment, as illustrated in FIG. 7. The M1 layer 602 is then patterned using a standard, subtractive process.

Antireflection coating 702 is a DARC (Dielectric Anti-Reflective Coating) layer, in one embodiment, which helps in the imaging and patterning of M1 layer 602. This coating also can slow later etching processes down, in some cases, and thus act as a hard mask. In one embodiment, antireflection coating 702 is formed from siliconoxynitride. Coating 702 has a thickness in a range of about 300–400 angstroms, with a thickness of about 360 angstroms being present in one embodiment. In other embodiments, antireflection coating 702 is non-existent, is thicker or thinner than the range specified above, or is formed from other suitable materials.

Figure 8:
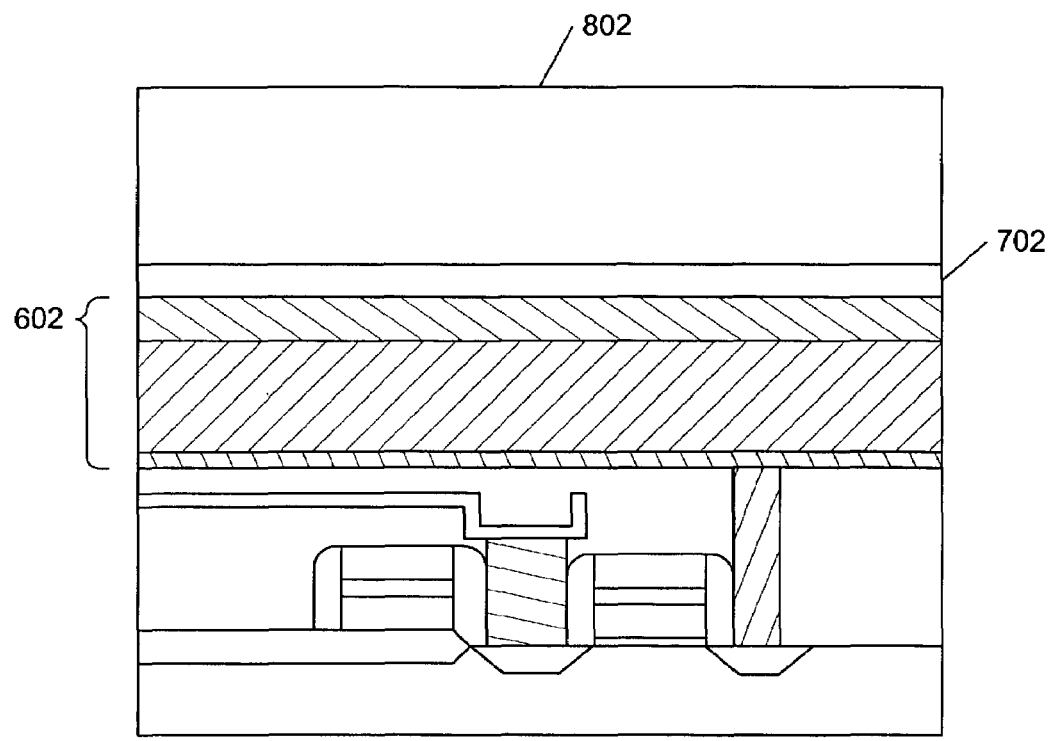

Next, an interlayer dielectric material 802 ("ILD") is deposited on the top surface of the antireflection coating 702, as illustrated in FIG. 8. In one embodiment, ILD 802 is formed from tetraethyloxysilicate (TEOS). ILD 802 has a thickness in a range of about 4500–5500 angstroms, with a thickness of about 5000 angstroms being present in one embodiment. In other embodiments, ILD 802 could be formed from other suitable dielectric materials, and could be thicker or thinner than the range specified above. For example, ILD 802 could include other insulative materials, such as oxides or nitrides.

In one embodiment, ILD 802 is planarized using a chemical-mechanical polishing (CMP) process to smooth the top surface. Smoothing the top surface of ILD 802 has been shown to improve the overall performance of the device. Other mechanical or non-mechanical smoothing techniques may also be used, such as alternative etch processes (e.g., reactive ion etching) or chemical dissolution. In another embodiment, the top surface is not planarized.

Figure 9:
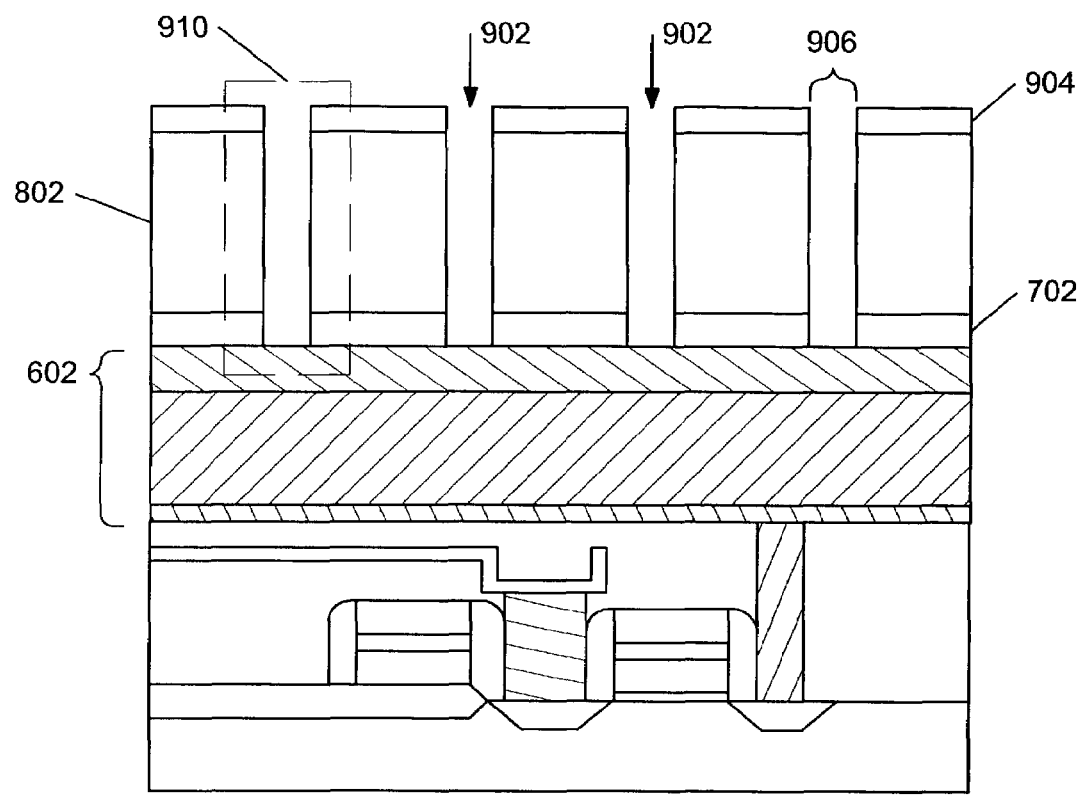

Next, as illustrated in FIG. 9, trench via openings 902 are formed through ILD 802 using a photoresist process. The trench via openings 902 extend vertically downward through ILD 802 to an underlying portion of M1 layer 602. In one embodiment, a length of each opening in a horizontal plane is sufficiently greater than a width of the opening in the horizontal plane, so that the opening has a trench shape (See FIG. 2, illustrating the width 214 and length, from 210 to 212, of a trench via).

The process of forming the openings 902 involves first forming a photoresist layer 904 over ILD 802. The resist layer 904 contains a resist material that is light or energy sensitive, such that resist material receiving exposure will have physical characteristics different from resist material not receiving exposure.

Such resist materials are typically reactive to a specific set or range of energy types (e.g., a specific set or range of wavelengths of light). The resist layer is preferably OIR-897-10I photoresist produced by Olin Corporation or PFI 66A7 photoresist produced Sumitomo Chemical Co. LTD as used herein, although numerous other photoresist compositions and technologies could be used.

A reticle or mask is placed over the resist layer 904 in order to selectively block waves directed toward the surface of the resist layer. The resist layer 904 is then exposed to electromagnetic radiation or light waves, typically UV light, of a type capable of exposing the resist material in the resist layer. In one embodiment, the resist layer contains photoresist material of a positive type (i.e., that which is more easily removed, or more vulnerable to solvents, when exposed to light or energy). Exposed resist portions are then removed using conventional washing techniques (e.g., washing with a solution of aqueous TMAH), leaving portions of the ILD layer 802 uncovered. In an alternate embodiment, a negative type photoresist could be used (i.e., that which is more resistant to removal, when exposed to light or energy, than unexposed areas of the resist). In the latter embodiment, the mask or reticle would be appropriately and obviously modified.

After the photoresist is selectively removed, a patterned layer of resist 904 remains on the top surface of ILD 802. Uncovered portions of ILD 802 are then modified and removed, resulting in the formation of trench via openings 902. To complete the opening formation process, underexposed resist portions are then removed. Removal of underexposed resist portions can include traditional methods such as using a hydrogen peroxide and sulfuric acid solution ("piranha etch" or "Carro's acid").

In one embodiment, conventional circular via openings (not illustrated) also can be formed simultaneously with the trench via openings, where desired. Forming the trench and conventional via openings simultaneously is advantageous because both can be formed using only one mask and photoresist process.

In one embodiment, the width 906 of the trench via openings 902 is in a range of about 0.2–0.35 microns, although the width 906 could be larger or smaller in other embodiments. Also, the length (not illustrated) of the trench via openings 902 are greater than twice the width 906, in one embodiment. In some cases, the lengths of the trench via openings 902 can be five or more times the width 906 of the openings.

After forming the trench via openings 902, these openings are filled with conductive material, while simultaneously forming the next metal layer, referred to herein as the "M2" layer. In one embodiment, the openings are filled using a four-step process, which is illustrated in FIGS. 10–13. Specifically, FIGS. 10–13 are side, cross-sectional views of an enlarged, single via 910 (FIG. 9) of the semiconductor device illustrated in FIG. 9 (with photoresist 904 removed), after various subsequent processes in accordance with an embodiment of the invention.

Figure 10:
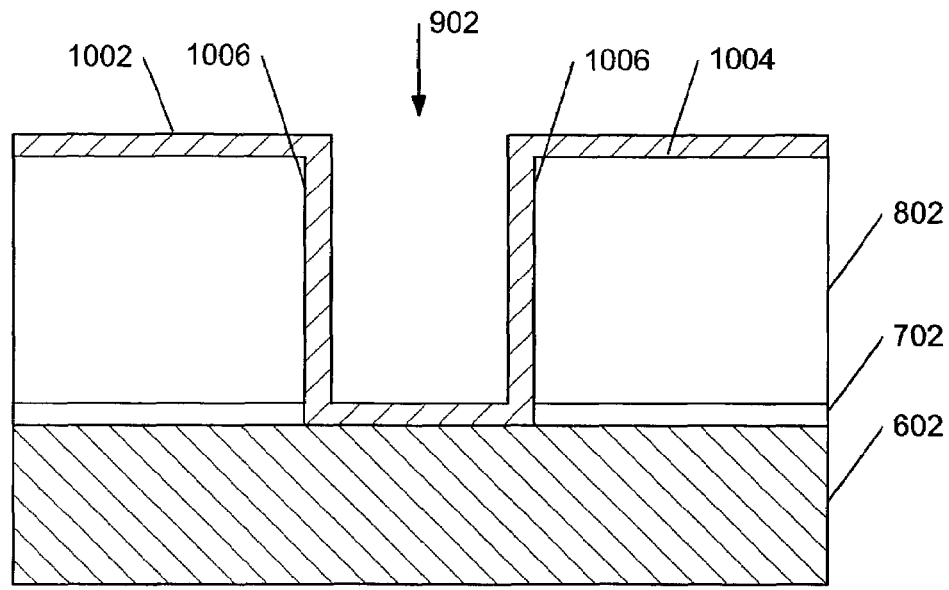
FIGS. 10–13 are side, cross-sectional views of an enlarged section of the semiconductor device illustrated in FIG. 9, after various subsequent processes in accordance with an embodiment of the invention.

First, as illustrated in FIG. 10, a conductive coating layer 1002 is deposited in contact with the bottom and sidewalls 1006 of the via opening 902, and also above the top surface 1004 of ILD 802. In one embodiment, coating layer 1002 includes titanium or a titanium alloy, which is deposited using a PVD process. This layer has a thickness in a range of about 100–200 angstroms, with the thickness being about 150 angstroms in one embodiment. In other embodiments, coating layer 1002 could be thicker or thinner than the range specified above, and could be formed from different suitable materials. Titanium is a particularly well suited to the embodiment described, because it has been shown to cause subsequent aluminum layers to adhere well, and also enables via widths of 0.3 microns or less to be reliably achieved.

Figure 11:
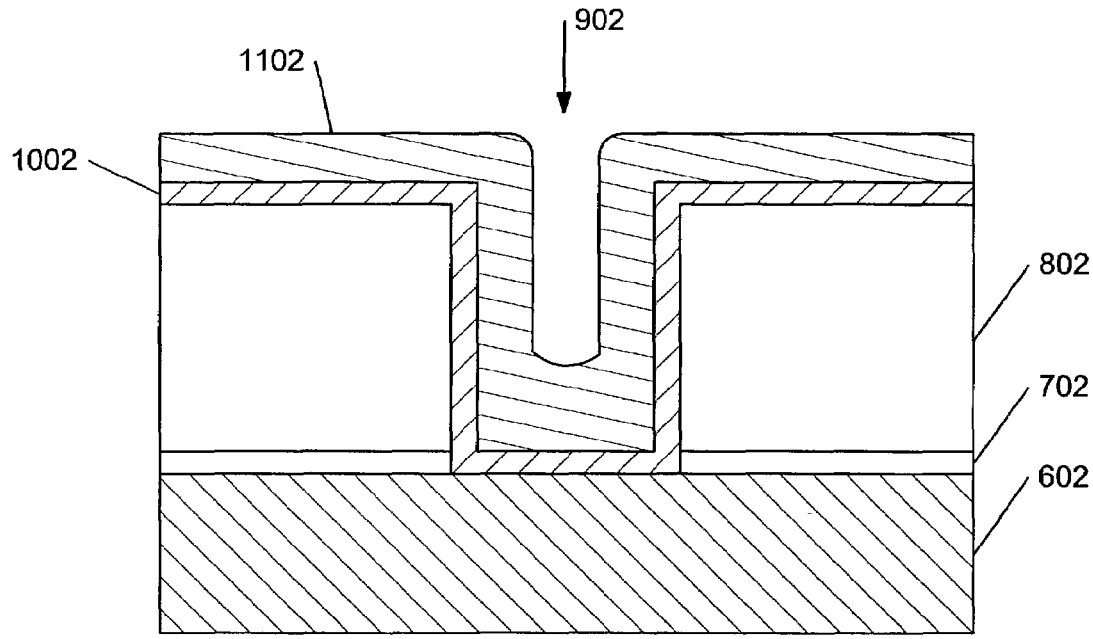

Next, as illustrated in FIG. 11, a first layer 1102 of aluminum or aluminum alloy (e.g., an aluminum/copper alloy) is deposited in contact with the coating layer 1002 using a "cold aluminum" process. This process involves depositing the material using a PVD process. In one embodiment, the deposition temperature is between about 0–250 degrees Celsius (C.) and at a pressure between about $1 \times 10^{-7}$ to $1 \times 10^{-2}$ torr, although temperatures and pressures higher or lower than these ranges could be used in other embodiments. After initially depositing the material, the material is then reflowed, in one embodiment, at a temperature between about 300–400 degrees C. and at a pressure between about $1 \times 10^{-7}$ to $1 \times 10^{-2}$ torr. In an alternate embodiment, the material is not reflowed. In another alternate embodiment, the material is initially deposited at a temperature in a range of about 250–350 degrees C., and is not reflowed. Either way, the first layer 1102 is deposited at a temperature below about 400 degrees C.

The first layer 1102 has a thickness in a range of about 2500–3500 angstroms, with the thickness being about 3000 angstroms in one embodiment. In other embodiments, the first layer 1102 could be thicker or thinner than the range specified above, and could be formed from a different suitable material. The first layer 1102 serves to further coat the interior of the via opening 902 and the top surface of the device.

Figure 12:
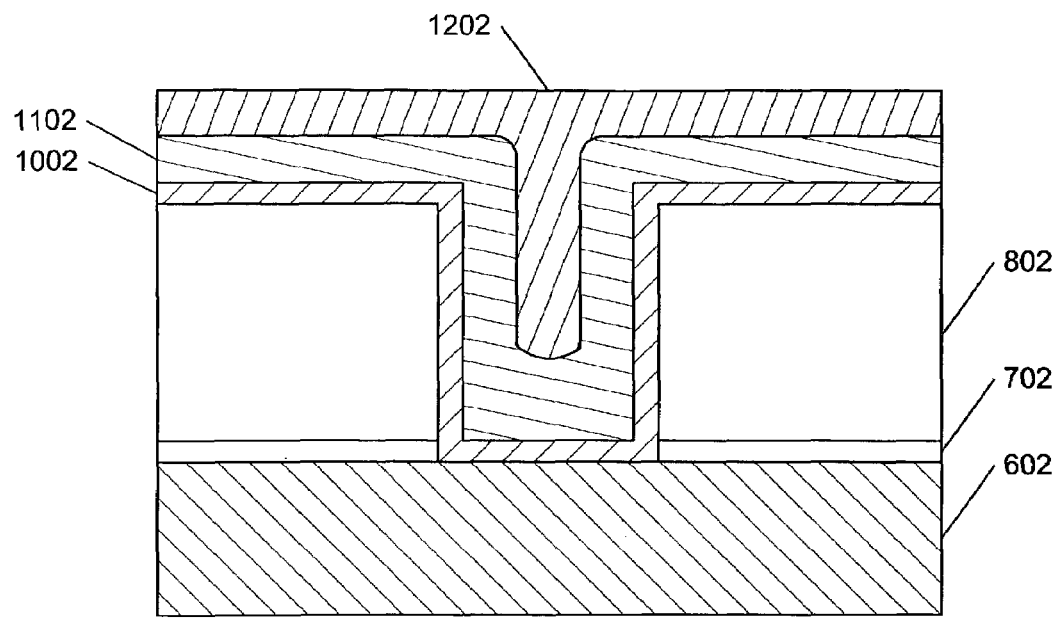

A "hot aluminum" process is then used to deposit a second layer 1202 of aluminum or aluminum alloy (e.g., an aluminum/copper alloy) in contact with the first layer 1102, as illustrated in FIG. 12. This process involves depositing the material using a PVD process at a temperature of about 465 degrees C. or higher, with the deposition temperature being in a range of about 450–480 degrees C., in one embodiment. The deposition pressure is in a range of about $1 \times 10^{-7}$ to $1 \times 10^{-2}$ torr, in one embodiment. Temperatures and pressures higher or lower than these ranges could be used in other embodiments. One advantage to using a hot aluminum process is that the aluminum flows into and fills the trench and other vias much more completely than it does using prior art methods.

The second layer 1202 has a thickness in a range of about 2500–3500 angstroms, with the thickness being about 3000 angstroms in one embodiment. In other embodiments, the second aluminum layer 1202 could be thicker or thinner than the range specified above, and could be formed from a different suitable material. In one embodiment, the second layer 1202 fills the remainder of the via openings, and increases the thickness of the conductive material on the top surface of the device.

Figure 13:
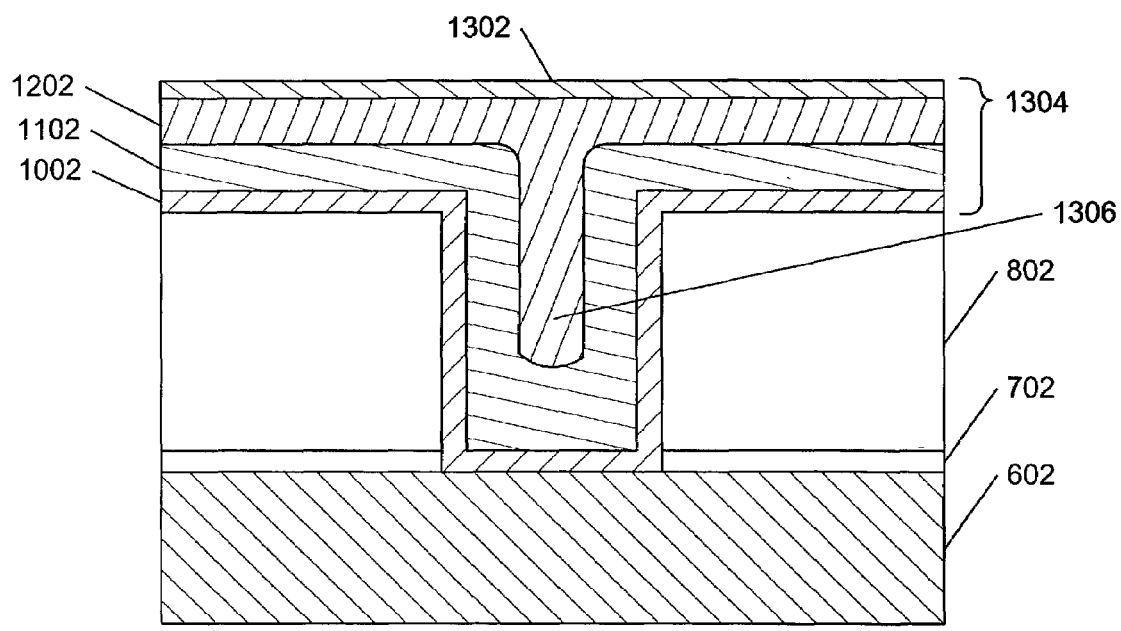

Next, a top conductive layer 1302 is deposited over the second layer 1202, as illustrated in FIG. 13. In one embodiment, top conductive layer 1302 includes TiN, which is deposited using a PVD process. This layer has a thickness in a range of about 200–300 angstroms, with the thickness being about 250 angstroms in one embodiment. In other embodiments, top layer 1302 could be thicker or thinner than the range specified above, and could be formed from different suitable materials.

The result of the four-step, conductive material deposition process is an M2 layer 1304 and one or more filled trench vias 1306. Although the embodiments described above for forming the M2 layer 1304 use a four-step process, more or fewer layers could be deposited in order to form the M2 layer 1304. In addition, in various embodiments, some or all of layers 1002, 1102, 1202, and 1302 (FIGS. 10–13) could be deposited using a CVD or other process, rather than a PVD process. Also, conductive materials other than those described could be used to form the M2 layer 1304. Suitable, alternative, conductive materials for forming metal layers are well known in the art, such as tungsten, copper, aluminum, or other materials or alloys.

The M2 layer 1304 is then patterned, in one embodiment, by selectively removing portions of the conductive material from the top surface of ILD 802 using subtractive technologies that are new or are well understood in the art. After patterning the M2 layer 1304, one or more additional layers of dielectric and conductive material (e.g., layers M3, M4, etc.) can be built on top of the M2 layer 1304 using the techniques and materials described above and/or other device build-up techniques that are new or are well understood in the art. In addition, interconnects between the M1, M2, and/or the new conductive layers can be formed. These additional interconnects between the conductive layers can include trench vias, as described in conjunction with the embodiments above. Alternatively, a passivation layer can be formed on top of the M2 layer 1304, after which the device build-up process can be considered to be essentially complete. Trench vias can interconnect adjacent layers (i.e., layers separated by a single dielectric layer) and/or layers that are non-adjacent (i.e., layers that are separated by one or more intervening conductive layers, as well as dielectric layers).

The memory cells described above can form a portion of a memory device, in accordance with various embodiments. This memory device can be, for example, a DRAM, SRAM, Flash memory or other type of memory device. Alternatively, the trench vias and their formation methods, described in conjunction with the various embodiments above, can be integrated into another type of device (e.g., a microprocessor or ASIC).

Memory Devices

Figure 14:
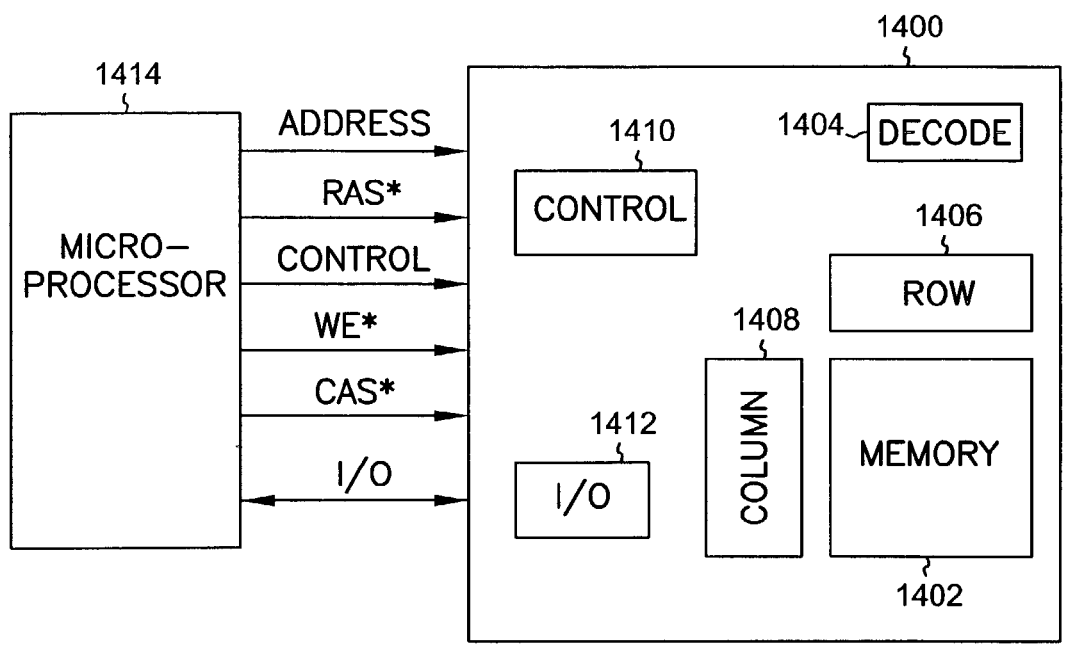
FIG. 14 is a simplified block diagram of an integrated circuit memory device in accordance with an embodiment of the invention.

FIG. 14 is a simplified block diagram of an integrated circuit memory device according to one embodiment of the invention. In one embodiment, memory cells, such as those described in conjunction with FIG. 1, are suitable for use in memory devices. Other types of memory cells having structures well understood in the art are also suitable for use in memory devices.

The memory device 1400 includes an array of memory cells 1402, address decoder 1404, row access circuitry 1406, column access circuitry 1408, control circuitry 1410, and Input/Output circuit 1412. The memory can be coupled to an external microprocessor 1414, or memory controller for memory accessing. The memory receives control signals from the processor 1414, such as WE*, RAS* and CAS* signals. The memory is used to store data which is accessed via I/O lines. It will be appreciated by those skilled in the art that additional circuitry and control signals can be provided, and that the memory device of FIG. 14 has been simplified to help focus on the invention. The memory device includes at least one trench via, in accordance with the various embodiments of the invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 15:
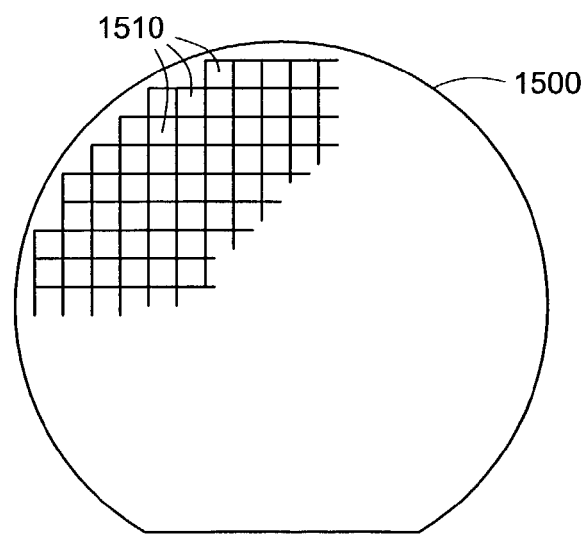
FIG. 15 is a top-down, elevational view of a wafer containing semiconductor dies in accordance with an embodiment of the invention.

FIG. 15 is a top-down, elevational view of a wafer 1500 containing semiconductor dies 1510 in accordance with an embodiment of the invention. A die is an individual pattern, typically rectangular, on a substrate that contains circuitry, or integrated circuit devices, to perform a specific function. At least one of the integrated circuit devices includes a trench via, embodiments of which are disclosed herein. A semiconductor wafer will typically contain a repeated pattern of such dies containing the same functionality. Die 1510 may contain circuitry for the inventive memory device, as discussed above. Die 1510 may further contain additional circuitry to extend to such complex devices as a monolithic processor with multiple functionality. Die 1510 is typically packaged in a protective casing (not shown) with leads extending therefrom (not shown) providing access to the circuitry of the die for unilateral or bilateral communication and control.

Circuit Modules

Figure 16:
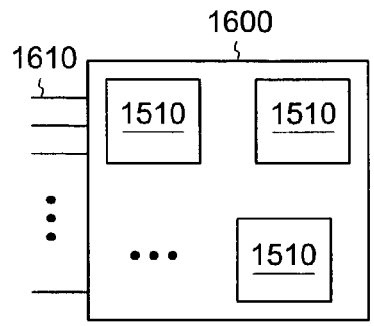
FIG. 16 is a simplified block diagram of an exemplary circuit module in accordance with an embodiment of the invention.

FIG. 16 is a simplified block diagram of an exemplary circuit module 1600 in accordance with an embodiment of the invention. As shown in FIG. 16, two or more dies 1510 may be combined, with or without protective casing, into circuit module 1600 to enhance or extend the functionality of an individual die 1510. Circuit module 1600 may be a combination of dies 1510 representing a variety of functions, or a combination of dies 1510 containing the same functionality. Some examples of a circuit module include memory modules, device drivers, power modules, communication modems, processor modules, and application-specific modules and may include multilayer, multichip modules. Circuit module 1600 may be a subcomponent of a variety of electronic systems, such as a clock, a television, a cellular or radio communication device (e.g., cell phone, pager, etc.), a desktop, handheld or portable computer, an automobile, an industrial control system, an aircraft, an automated teller machine, and others. Circuit module 1600 will have a variety of leads 1610 extending therefrom and coupled to the dies 1510 providing unilateral or bilateral communication and control.

Figure 17:
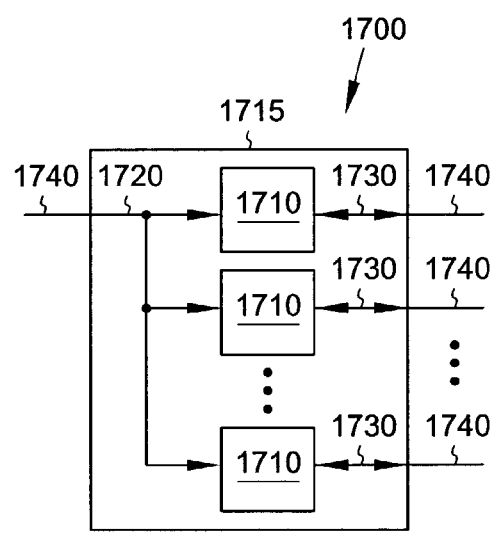
FIG. 17 is a simplified block diagram of an exemplary memory module in accordance with an embodiment of the invention.

FIG. 17 is a simplified block diagram of an exemplary memory module 1700, which is one embodiment of a circuit module. Memory module 1700 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 1700 contains multiple memory devices 1710 contained on support 1715, the number depending upon the desired bus width and the desire for parity. Memory module 1700 may contain memory devices 1710 on both sides of support 1715. Memory module 1700 accepts a command signal from an external controller (not shown) on a command link 1720 and provides for data input and data output on data links 1730. The command link 1720 and data links 1730 are connected to leads 1740 extending from the support 1715. Leads 1740 are shown for conceptual purposes and are not limited to the positions shown in FIG. 17.

Electronic Systems

Figure 18:
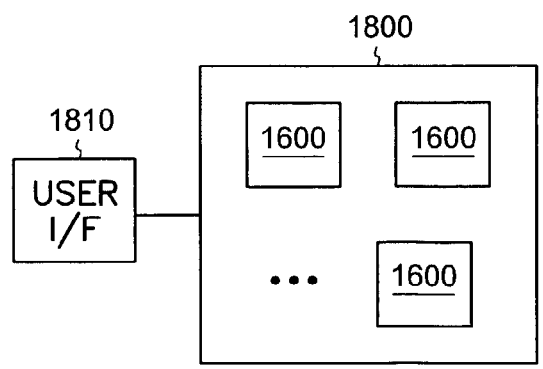
FIG. 18 is a simplified block diagram of an exemplary electronic system in accordance with an embodiment of the invention.

FIG. 18 is a simplified block diagram of an exemplary electronic system 1800 containing one or more circuit modules 1600 in accordance with an embodiment of the invention. Electronic system 1800 generally contains a user interface 1810. User interface 1810 provides a user of the electronic system 1800 with some form of control or observation of the results of the electronic system 1800. Some examples of user interface 1810 include a keyboard, pointing device, monitor, and printer of a computer; a keypad, speaker, microphone, and display of a communication device; a tuning dial, display, and speakers of a radio; an ignition switch and gas pedal of an automobile; and a card reader, keypad, display, and currency dispenser of an automated teller machine. User interface 1810 may further describe access ports provided to electronic system 1800. Access ports are used to connect an electronic system to the more tangible user interface components previously exemplified.

One or more of the circuit modules 1600 may be a processor providing some form of manipulation, control or direction of inputs from or outputs to user interface 1810, or of other information either preprogrammed into, or otherwise provided to, electronic system 1800. As will be apparent from the lists of examples previously given, electronic system 1800 will often contain certain mechanical components (not shown) in addition to circuit modules 1600 and user interface 1810. It will be appreciated that the one or more circuit modules 1600 in electronic system 1800 can be replaced by a single integrated circuit. Furthermore, electronic system 1800 may be a subcomponent of a larger electronic system.

Figure 19:
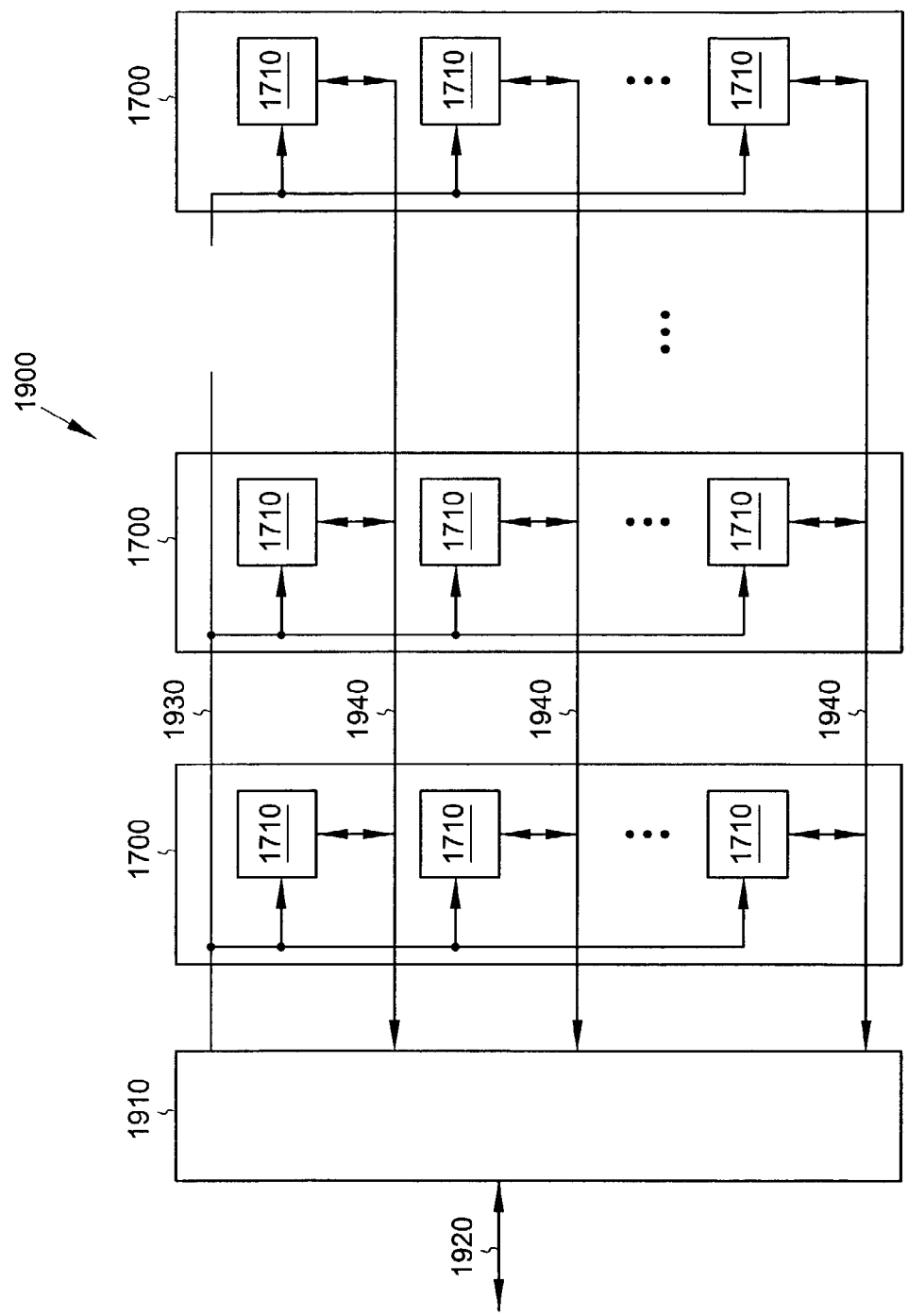
FIG. 19 is a simplified block diagram of an exemplary memory system in accordance with an embodiment of the invention.

FIG. 19 is a simplified block diagram of an exemplary memory system 1900, which is one embodiment of an electronic system. Memory system 1900 contains one or more memory modules 1700 and a memory controller 1910. Memory controller 1910 provides and controls a bidirectional interface between memory system 1900 and an external system bus 1920. Memory system 1900 accepts a command signal from the external bus 1920 and relays it to the one or more memory modules 1700 on a command link 1930. Memory system 1900 provides for data input and data output between the one or more memory modules 1700 and external system bus 1920 on data links 1940.

Figure 20:
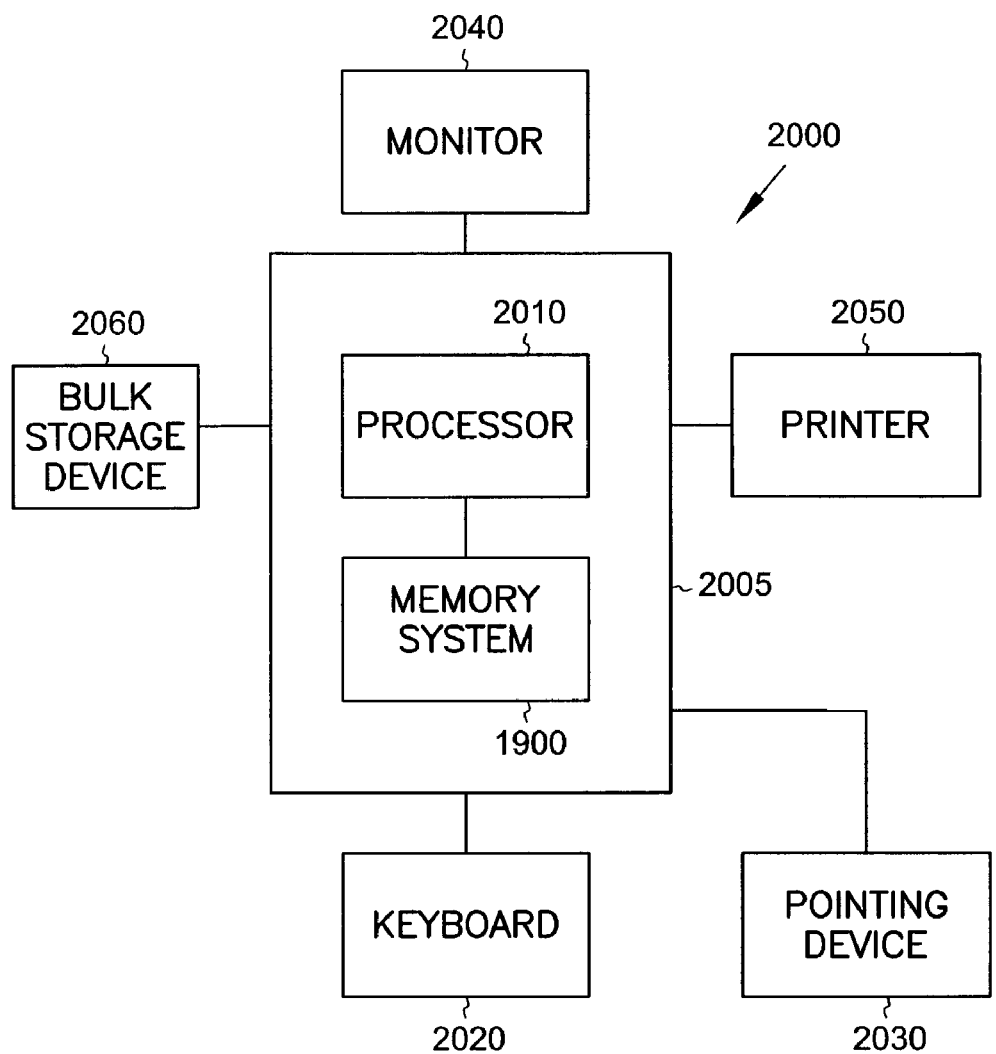
FIG. 20 is a simplified block diagram of an exemplary computer system in accordance with an embodiment of the invention.

FIG. 20 is a simplified block diagram of an exemplary computer system 2000, which is a further embodiment of an electronic system. Computer system 2000 contains a processor 2010 and a memory system 1900 housed in a computer unit 2005. Computer system 2000 is but one example of an electronic system containing another electronic system (e.g., memory system 1900) as a subcomponent. Computer system 2000 optionally contains user interface components. Depicted in FIG. 20 are a keyboard 2020, a pointing device 2030, a monitor 2040, a printer 2050, and a bulk storage device 2060. It will be appreciated that other components are often associated with computer system 2000 such as modems, device driver cards, additional storage devices, etc. It will further be appreciated that the processor 2010 and memory system 1900 of computer system 2000 can be incorporated on a single integrated circuit. Such single package processing units reduce the communication time between the processor and the memory circuit.

CONCLUSION

Prior art vias, which are used to interconnect metal layers of a semiconductor device, suffer performance and reliability degradations when implemented in submicron dimensions. This is primarily due to the vias' physical configurations, and due to the materials and methods currently used for forming the vias. These methods often produce vias with unacceptably high resistance and $I^2R$ losses, and result in significant cusping, electromigration, and other via failures.

Embodiments of the present invention provide a trench via structure, which can be reliably formed in submicron dimensions with very low resistance and $I^2R$ losses. The trench vias are formed simultaneously with forming a metal layer, by sequentially depositing layers of conductive material in the via openings and on the top surface of the dielectric layer in which the via openings exist. The particular materials used in these sequentially-deposited layers, and the thicknesses of these layers, enable trench and other vias to be formed with a lower incidence of cusping and electromigration failures.

While the invention has been described and illustrated with respect to forming trench vias between metal layers above a memory cell, it should be apparent that the same processing techniques can be used to form trench vias for other applications, and also to form conventional circular vias or plugs. In addition, the interconnect structures formed using the methods of the various embodiments could electrically connect a metal layer and a plug, rather than two metal layers. Furthermore, the methods described herein may be used in the development of contacts. The process used for forming a contact is very similar. The difference is well known in the art and consists of the fact that the contact, rather than interconnecting two metal layers, typically contacts an underlying portion of a semiconductor device.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A semiconductor die, comprising:
an integrated circuit supported by a substrate and having a plurality of integrated circuit devices, wherein at least one device of the plurality of integrated circuit devices includes a first metal layer above the device, an insulating layer above the first metal layer, a second metal layer above the insulating layer, and at least one trench via, wherein the trench via is formed within an opening extending vertically downward through the insulating layer to an underlying portion of the first metal layer, wherein a length of the opening in a horizontal plane is sufficiently greater than a width of the opening in the horizontal plane so that the opening has a trench shape, and wherein the trench via and the second metal layer are integrally formed together from three or more layers of conductive material deposited within the opening and above the insulating layer.

2. The semiconductor die of claim 1, wherein the three or more layers of conductive material comprise:
a coating layer formed of a conductive material in contact with a bottom and sidewalls of the opening;
a first conductive layer containing aluminum in contact with the coating layer, wherein the first conductive layer partially fills the opening; and a second conductive layer containing aluminum in contact with the first conductive layer, wherein the second conductive layer substantially fills a remainder of the opening.

3. The semiconductor die of claim 2, wherein the coating layer includes titanium, and has a thickness in a range of about 100–200 angstroms.

4. The semiconductor die of claim 2, wherein the first conductive layer has a thickness in a range of about 2500–3500 angstroms.

5. The semiconductor die of claim 2, wherein the second conductive layer has a thickness in a range of about 2500–3500 angstroms.

6. The semiconductor die of claim 2, wherein the first conductive layer is deposited at a first temperature in a range of about 0–250 degrees C., and the second conductive layer is deposited at a second temperature that is higher than about 450 degrees C.

7. The semiconductor die of claim 2, further comprising a third conductive layer containing Ti N in contact with the second conductive layer.

8. The semiconductor die of claim 7, wherein the third conductive layer has a thickness in a range of about 200–300 angstroms.

9. A semiconductor die, comprising:
an integrated circuit supported by a substrate and having a plurality of integrated circuit devices, wherein at least one of the plurality of integrated circuit devices includes a first metal layer above the device, an insulating layer above the first metal layer, a second metal layer above the insulating layer, and at least one trench via integrally formed with the second metal layer, wherein the trench via includes
an opening extending vertically downward through the insulating layer to an underlying portion of the first metal layer;
a coating layer of a conductive material in contact with a bottom and sidewalls of the opening;
a first conductive layer containing aluminum in the opening and in contact with the coating layer; and
a second conductive layer containing aluminum in the opening and in contact with the first conductive layer, wherein the coating layer, the first conductive layer, and the second conductive layer substantially fill the opening and form the second metal layer above the insulating layer.

10. The semiconductor die of claim 9, wherein the first conductive layer is deposited at a first temperature in a range of about 0–250 degrees C.

11. The semiconductor die of claim 9, wherein the second conductive layer is deposited at a second temperature of about 450 degrees C. or higher.

12. The semiconductor die of claim 9, wherein the coating layer has a thickness in a range of about 100–200 angstroms, the first conductive layer has a thickness in a range of about 2500–3500 angstroms, and the second conductive layer has a thickness in a range of about 2500–3500 angstroms.

13. A memory device, comprising:
an array of memory cells that includes:
one or more memory cells, each with a transistor, a capacitive structure, and a conductive contact;
a first metal layer directly above and in contact with the one or more memory cells, so that the first metal layer physically and electrically connects with the conductive contact;
an insulating layer above the first metal layer;
a second metal layer above the insulating layer; and
at least one trench via, wherein the trench via is formed within an opening extending vertically downward through the insulating layer to an underlying portion of the first metal layer, wherein a length of the opening in a horizontal plane is sufficiently greater than a width of the opening in the horizontal plane so that the opening has a trench shape, and wherein the trench via and the second metal layer are integrally formed together from three or more layers of conductive material deposited within the opening and above the insulating layer;
a row access circuit coupled to the array of memory cells;
a column access circuit coupled to the array of memory cells; and
an address decoder circuit coupled to the row access circuit and the column access circuit.

14. The memory device of claim 13, wherein the three or more layers of conductive material within the trench via comprises:
a coating layer formed of a conductive material in contact with a bottom and sidewalls of the opening;
a first conductive layer containing aluminum in contact with the coating layer, wherein the first conductive layer partially fills the opening; and
a second conductive layer containing aluminum in contact with the first conductive layer, wherein the second conductive layer substantially fills a remainder of the opening.

15. The memory device of claim 14, wherein the coating layer includes titanium, and has a thickness in a range of about 100–200 angstroms.

16. The memory device of claim 14, wherein the first conductive layer has a thickness in a range of about 2500–3500 angstroms.

17. The memory device of claim 14, wherein the second conductive layer has a thickness in a range of about 2500–3500 angstroms.

18. The memory device of claim 14, wherein the first conductive layer is deposited at a first temperature in a range of about 0–250 degrees C., and the second conductive layer is deposited at a second temperature that is higher than about 450 degrees C.

19. The memory device of claim 14, further comprising a third conductive layer containing Ti N in contact with the second conductive layer.

20. The memory device of claim 19, wherein the third conductive layer has a thickness in a range of about 200–300 angstroms.

21. A memory device, comprising:
an array of memory cells that includes:
one or more memory cells, each with a transistor, a capacitive structure, and a conductive contact;
a first metal layer directly above and in contact with the one or more memory cells, so that the first metal layer physically and electrically connects with the conductive contact;
an insulating layer above the first metal layer;
a second metal layer above the insulating layer; and
at least one trench via integrally formed with the second metal layer, wherein the trench via includes
an opening extending vertically downward through the insulating layer to an underlying portion of the first metal layer;
a coating layer of a conductive material in contact with a bottom and sidewalls of the opening;
a first conductive layer containing aluminum in the opening and in contact with the coating layer; and a second conductive layer containing aluminum in the opening and in contact with the first conductive layer, wherein the coating layer, the first conductive layer, and the second conductive layer substantially fill the opening and form the second metal layer above the insulating layer;

a row access circuit coupled to the array of memory cells;

a column access circuit coupled to the array of memory cells; and an address decoder circuit coupled to the row access circuit and the column access circuit.

22. The memory device of claim 21, wherein the first conductive layer is deposited at a first temperature in a range of about 0–250 degrees C.

23. The memory device of claim 21, wherein the second conductive layer is deposited at a second temperature of about 450 degrees C. or higher.

24. The memory device of claim 21, wherein the coating layer has a thickness in a range of about 100–200 angstroms, the first conductive layer has a thickness in a range of about 2500–3500 angstroms, and the second conductive layer has a thickness in a range of about 2500–3500 angstroms.

25. An electronic system, comprising:

a processor; and a circuit module having a plurality of leads coupled to the processor, and further having a semiconductor die coupled to the plurality of leads, wherein the semiconductor die comprises:

an integrated circuit supported by a substrate and having a plurality of integrated circuit devices, wherein at least one of the plurality of integrated circuit devices includes a first metal layer above the device, an insulating layer above the first metal layer, a second metal layer above the insulating layer, and at least one trench via, wherein the trench via is formed within an opening extending vertically downward through the insulating layer to an underlying portion of the first metal layer, wherein a length of the opening in a horizontal plane is sufficiently greater than a width of the opening in the horizontal plane so that the opening has a trench shape, and wherein the trench via and the second metal layer are integrally formed together from three or more layers of conductive material deposited within the opening and above the insulating layer.

26. The electronic system of claim 25, wherein the three or more layers of conductive material within the trench via comprises:

a coating layer formed of a conductive material in contact with a bottom and sidewalls of the opening;

a first conductive layer containing aluminum in contact with the coating layer, wherein the first conductive layer partially fills the opening; and a second conductive layer containing aluminum in contact with the first conductive layer, wherein the second conductive layer substantially fills a remainder of the opening.

27. An electronic system, comprising:

a processor; and a circuit module having a plurality of leads coupled to the processor, and further having a semiconductor die coupled to the plurality of leads, wherein the semiconductor die comprises:

an integrated circuit supported by a substrate and having a plurality of integrated circuit devices, wherein at least one of the plurality of integrated circuit devices includes a first metal layer above the device, an insulating layer above the first metal layer, a second metal layer above the insulating layer, and at least one trench via integrally formed with the second metal layer, wherein the trench via includes an opening extending vertically downward through the insulating layer to an underlying portion of the first metal layer;

a coating layer of a conductive material in contact with a bottom and sidewalls of the opening;

a first conductive layer containing aluminum in the opening and in contact with the coating layer; and a second conductive layer containing aluminum in the opening and in contact with the first conductive layer, wherein the coating layer, the first conductive layer, and the second conductive layer substantially fill the opening and form the second metal layer above the insulating layer.

28. The electronic system of claim 27, wherein the first conductive layer is deposited at a first temperature in a range of about 0–250 degrees C.

29. The electronic system of claim 27, wherein the second conductive layer is deposited at a second temperature of about 450 degrees C. or higher.

* * * * *

UNITED STATES PATENT AND TRADEMARK OFFICE
CERTIFICATE OF CORRECTION

| | |
|---|---|
| PATENT NO. | : 7,138,719 B2 |
| APPLICATION NO. | : 10/232184 |
| DATED | : November 21, 2006 |
| INVENTOR(S) | : Ireland |

Page 1 of 1

It is certified that error appears in the above-identified patent and that said Letters Patent is hereby corrected as shown below:

On the face page, in field (56), under "U.S. Patent Documents", in column 2, line 7, after "6,518,669" delete "B1 *" and insert -- B2 * --, therefor.

In column 1, line 64, delete "Ti N," and insert -- TiN, --, therefor.

In column 2, line 14, delete "be,formed" and insert -- be formed --, therefor.

In column 5, line 7, delete "interlayer" and insert -- inter-layer --, therefor.

In column 9, line 8, delete "LTD" and insert -- Ltd. --, therefor.

In column 9, line 36, delete ""Carro's acid")." and insert -- "Caro's acid"). --, therefor.

In column 10, line 20, delete "1x10 $^{-2}$" and insert -- 1x10$^{-2}$--, therefor.

In column 10, line 42, delete "1x10 $^{-2}$" and insert -- 1x10$^{-2}$--, therefor.

In column 15, line 20, in Claim 7, delete "Ti N" and insert-- TiN --, therefor.

In column 16, line 44, in Claim 19, delete "Ti N" and insert --TiN --, therefor.

Signed and Sealed this

Third Day of April, 2007

JON W. DUDAS
*Director of the United States Patent and Trademark Office*